(12) United States Patent  (10) Patent No.: US 8,045,663 B2
Bae et al.                    (45) Date of Patent:     Oct. 25, 2011

(54) CIRCUIT AND METHOD FOR REMOVING SKEW IN DATA TRANSMITTING/RECEIVING SYSTEM

(75) Inventors: Seung-Jun Bae, Daejeon-si (KR); Kwang-Il Park, Yongin-si (KR); Seong-jin Jang, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 811 days.

(21) Appl. No.: 12/029,518

(22) Filed: Feb. 12, 2008

(65) Prior Publication Data
US 2008/0130811 A1  Jun. 5, 2008

Related U.S. Application Data

(63) Continuation-in-part of application No. 11/770,766, filed on Jun. 29, 2007, now Pat. No. 7,542,372.

(30) Foreign Application Priority Data
Jun. 30, 2006  (KR) .................. 10-2006-0060285

(51) Int. Cl.
*H04L 7/00* (2006.01)
(52) U.S. Cl. .............. 375/355; 712/E9.063; 713/503; 714/700
(58) Field of Classification Search .................. None
See application file for complete search history.

(56) References Cited

U.S. PATENT DOCUMENTS

| 4,630,098 | A | 12/1986 | Fling |
| 4,680,632 | A | 7/1987 | Willis et al. |
| 5,917,760 | A | 6/1999 | Millar |
| 6,075,832 | A | 6/2000 | Geannopoulos et al. |
| 6,121,815 | A | 9/2000 | Terada et al. |
| 6,810,486 | B2 | 10/2004 | Fayneh et al. |
| 2005/0138277 | A1* | 6/2005 | Koo .................. 711/105 |

FOREIGN PATENT DOCUMENTS

| KR | 2000-0056166 | 9/2000 |
| KR | 2003-0045264 | 6/2003 |

* cited by examiner

*Primary Examiner* — Dac Ha
*Assistant Examiner* — Adolf Dsouza
(74) *Attorney, Agent, or Firm* — Volentine & Whitt, PLLC

(57) ABSTRACT

A data transmission/reception system can lessen a skew between data and clock signal by substantially reducing a data reception error. The data transmission/reception system using a first clock signal and a second clock signal having a phase difference corresponding to a half of data bit period as compared with the first clock signal includes a skew information extracting unit and a timing control unit. The skew information extracting unit obtains and outputs skew edge information data necessary for a skew removal by sampling data transmitted in a training operating mode as one of the first and second clock signals in a receiving side. The timing control unit receives the skew edge information data through a transmitting side, and compares its phase with a phase of the transmitted data and controls a timing between transmission data and a transmission sampling clock signal applied to a transmission output unit according to the phase comparison result. Time taken in a training operation can be relatively shortened, and circuits of the receiving side can be simplified and power consumption can be relatively reduced.

11 Claims, 14 Drawing Sheets

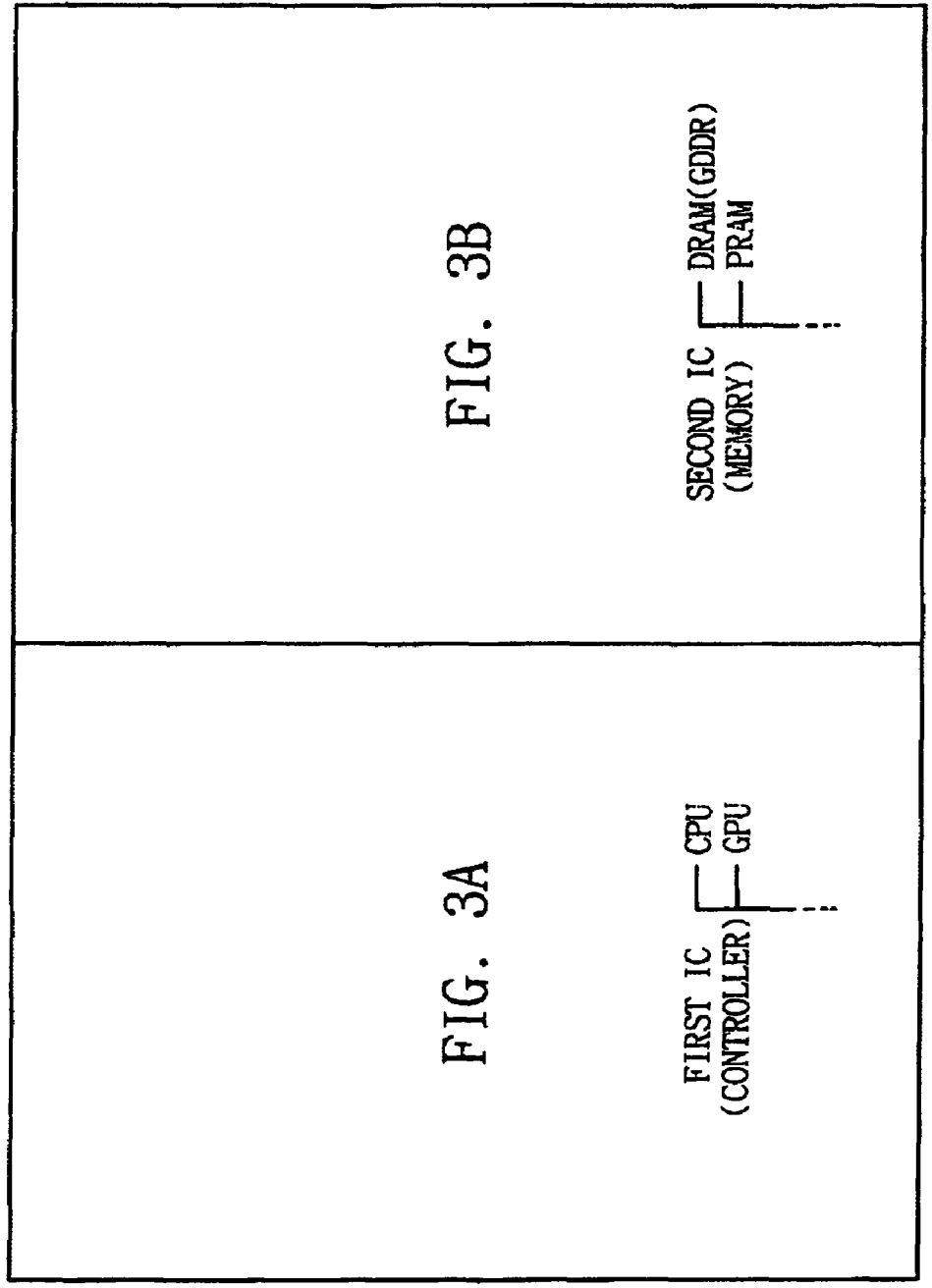

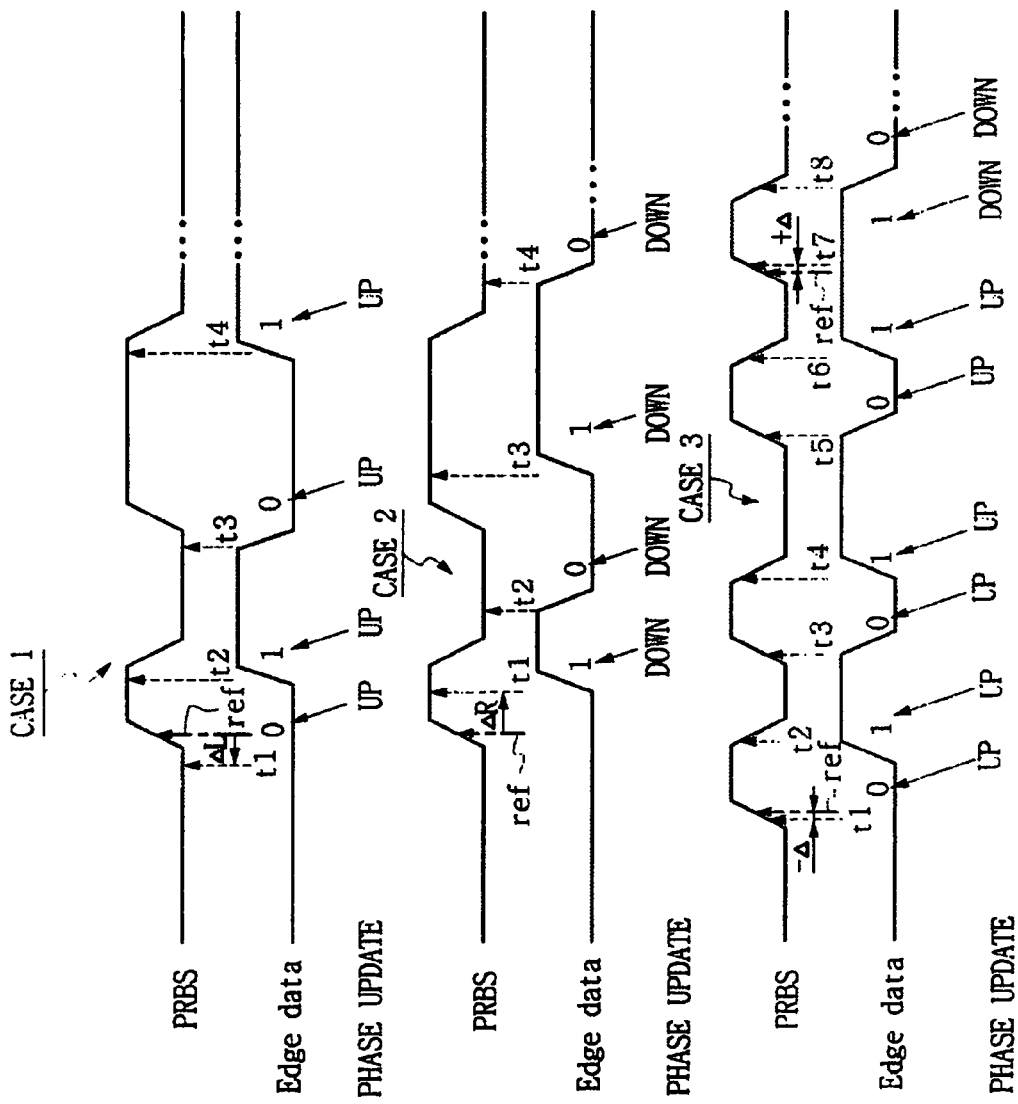

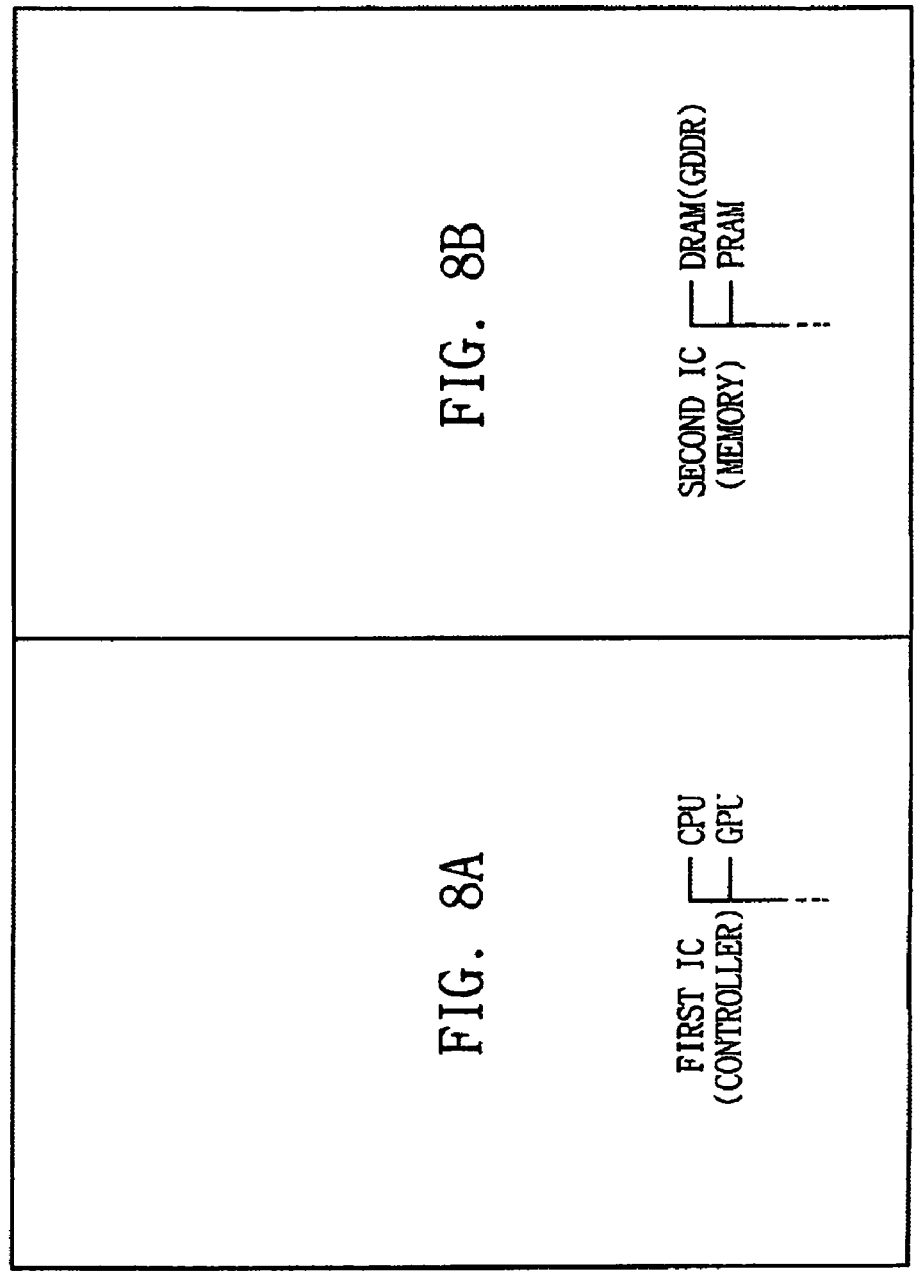

CIRCUIT AND METHOD FOR REMOVING SKEW IN DATA TRANSMITTING/RECEIVING SYSTEM

CROSS REFERENCE TO RELATED APPLICATIONS

This is a continuation-in-part of U.S. non-provisional application Ser. No. 11/770,766, filed Jun. 29, 2007 now U.S. Pat. No. 7,542,372. In addition, this application claims priority under 35 U.S.C. §119 from Korean Patent Application 10-2006-0060285, filed on Jun. 30, 2006 the contents of which are hereby incorporated by reference in their entirety for all purposes as if fully set forth herein.

BACKGROUND AND SUMMARY

1. Technical Field

The present invention relates to a data transmission, and more particularly, to a skew removal circuit and method capable of reducing a skew between data and clock signal.

2. Description

A data transmission speed performed in a data transmission/reception system constructed of semiconductor device, i.e., CPU and semiconductor memory device, is becoming faster day by day according to the requirement of users. However, time jitter of PLL/DLL, offset generated by a process error of transmitter/receiver and a signal interference of transmission channel etc. cause a skew occurrence between data and a clock signal that samples data, thus this becomes the factor of limiting a data transmission speed increase.

In general, when the transmission speed of data becomes increased, voltage margin and time margin of data necessary for identifying bit information of data are more reduced. That is, to exactly identify data transmitted from a transmitting side without error at a receiving side, it is required to precisely place a clock signal to sample data at a position having a relatively largest time margin of data, i.e., center part of data.

For that, a conventional parallel link interface method has been employed a source synchronous scheme. In the source synchronous scheme, transmitting side transmits together with data and clock signal to be sampled to receiving side, and receiving side extracts the data and clock signal. But, in the source synchronous scheme, skew is generated by a mismatch between a data line and a sampling clock line and thus there is caused a limit in a high-speed operation having a very fast transmission speed.

Therefore, a skew removal method employing a clock data recovery (hereinafter, referred to as 'CDR') to remove skew between data and a clock signal has been mainly used in the field of serial link interface. In the skew removal method using the CDR, transmission data is oversampled at a receiving side, and a phase of transmission sampling clock of a transmitting side is controlled according to sampled information. Then, clock signal sampling the data (hereinafter, referred to as 'sampling clock') is controlled to have a relatively largest time margin for data to be sampled at the receiving side.

FIG. 1 illustrates a signal timing for a correlation between clock signals and data used in the CDR scheme according to a conventional art.

Referring to FIG. 1, two kinds of clock signals are shown for three cases in a lower part of data waveform. An edge clock Clk_edge with a reference character C1 is positioned in timing at an edge portion of 1 bit data, and data clock Clk_data with a reference character C2 is positioned in timing on a center part of the 1 bit data. A time interval between the data clock Clk_data and the edge clock Clk_edge corresponds to a half (0.5 UI) of data bit period UI as T_bit. In the drawing, the data clock Clk_data corresponds to the sampling clock and is a clock signal necessary for identifying data. On the other hand, the edge clock Clk_edge is a clock signal necessary for extracting edge information of data. In the following description, for example, when the edge clock is called a first clock signal, the data clock will be called a second clock signal.

In FIG. 1, for example, when data is changed from logic 0 to logic 1 or from logic 1 to logic 0, an early/late phase correlation between data and sampling clock Clk_data can be obtained by using the edge clock Clk_edge. For example, when the sampling clock Clk_data is positioned in timing after a center part of data bit period as shown in a second case S2 and so the data is delayed or the sampling clock Clk_data is advanced corresponding to a generated skew SKEW1, skew between data and sampling clock is removed and becomes like the first case shown in S1. Meanwhile, to the contrary, when sampling clock is positioned in timing before a center part of data bit period like a third case shown in S3, skew between data and sampling clock can be removed by advancing in timing corresponding to an interval of skew SKEW2 the data or shifting in timing the sampling clock.

Consequently, in the conventional CDR scheme using all of edge clock and data clock as illustrated in FIG. 1, data sampled as edge clock in 1 bit data period and data sampled as data clock can be obtained. Thus, the conventional CDR scheme obtains two information for 1 bit data period and so is called 'x2 oversampling' in view of a sampling technique. For example, when the edge clock Clk_edge tracks an edge of data, the data clock Clk_data is shifted 0.5 UI (Unit Interval) from the edge clock, and thus the timing is automatically matched to the center of data eye. Therefore, skew between data and sampling clock is substantially reduced by controlling a phase of sampling clock signal through use of over-sampled information.

The conventional CDR scheme may be advantageous by the characteristic that a sampling clock signal tracks a phase change of data and maintains a proper sampling position even during a transmission of data. That is, there is no special operation change even when temperature or voltage is changed.

However, the conventional CDR scheme necessarily requires a specific clock signal, i.e., edge clock Clk_edge, to identify edge information of data. When edge clock is used in addition to sampling clock in the receiving side, power consumption of the receiving side is added corresponding to that. Furthermore, the conventional CDR scheme must additionally include a reception circuit for identifying data and sampling clock and detecting an edge of data, and a phase control circuit for changing a phase of clock signal. The conventional CDR scheme has an overhead for circuits and so its application to the parallel link interface method as an interface method of DRAM etc. is not simple.

As another conventional art, a skew compensation scheme using a training method is known in a parallel link interface used in a DRAM (Dynamic Random Access Memory) etc.

In the skew compensation scheme using the training method, circuits can be realized on a small area as compared with the conventional CDR scheme and a skew removal function of almost the same level as the CDR scheme can be provided. Further, unlike the conventional CDR scheme, a specific circuit for an edge detection of data is not adapted at a receiving side.

The skew compensation scheme using a training method principally used in semiconductor memory devices such as DRAM etc. is described as follows, referring to FIG. 2.

With reference to FIG. 2 illustrating signal timings providing a correlation between clock signals and training data used in the training method, training data showing a 1 bit data period and a plurality of clock signals S1-S5 sequentially phase-shifted corresponding to a unit step are positioned being spaced in a lower part of the data.

In the training method, a phase shift operation is performed mainly in a transmitting side such as a memory controller etc., not in a semiconductor memory device as a receiving side.

In a training mode of the transmitting side, training data is transmitted at a frequency lower than a normal transmission operation of data. Then, the training data is stored in a data receiving part such as the semiconductor memory device etc. The memory controller reads the stored training data in synchronous to each of the plurality of clock signals S1-S5. That is, the training data is individually sampled by the clock signals S1-S5 phase-shifted corresponding to each step.

When a phase of sampling clock signal is changed by a time interval corresponding to 1 bit data period, the memory controller detects a reception error by comparing the transmitted training data with the individually sampled data. In this case, when phase information of sampling clock signals corresponding to sampling data having an error occurrence is detected, a sampling clock signal having a relatively smallest skew occurrence can be extracted. For example, in FIG. 2, when sampling clock signals S1-S4, S12-S15 having a fail F are detected, sampling clock signals S5-S11 having a relatively low probability for error occurrence can be obtained. That is, in FIG. 2, a sampling clock signal S8 with reference number 22 is obtained as a sampling clock signal having a relatively smallest skew.

However, in the skew removal method using the training data described above with reference to FIG. 2, an operating time of training mode is relatively long as compared with the conventional CDR scheme described referring to FIG. 1. Thus, the performance in a normal operation of system becomes fall when the operation of system is performed too frequently. Furthermore, even though a skew is changed by a temperature or voltage change, data must be still sampled as sampling clock signal having a skew occurrence before the training operation is performed. That is, data reception error may be caused.

As described above, in the skew compensation scheme using the training data there is an advantage an area of circuit is relatively small at a data receiving side, but time taken in a skew removal operation is relatively long and operation stability is weakened due to a temperature and voltage change.

Accordingly, some embodiments of the invention provide a semiconductor device capable of realizing circuits of compact size and substantially reducing power consumption.

Some embodiments of the invention provide a data transmission/reception system capable of shortening time to remove or reduce a skew between data and a clock signal as compared with a conventional skew compensation scheme using training data. The system comprises a skew removal circuit for reducing a circuit overhead of a receiving side and relatively lessening time taken in a training operation.

Some embodiments of the invention provide a data transmission/reception system and a skew removal method capable of realizing circuits in a receiving side more simply and so reducing power consumption.

Some embodiments of the invention provide a skew removal circuit capable of reducing a circuit area of a receiving side without employing an oversampling scheme.

Some embodiments of the invention provide a skew removal circuit and a skew removal method thereof, capable of reducing a circuit overhead of a transmitting side even in employing an oversampling scheme.

Some embodiments of the invention provide a skew removal circuit of an oversampling scheme capable of shortening a skew removal operating time in a circuit of a transmitting side.

Some embodiments of the invention provide an improved skew removal circuit capable of producing increase/decrease information data for a removal of skew in a semiconductor memory device.

Some embodiments of the invention provide a skew removal circuit and a skew removal method thereof, capable of solving a dynamic skew problem that a skew between data and clock signal is frequently changed by a temperature or voltage change. The skew removal can be performed in real time in a normal operating section to access data.

According to an embodiment of the invention, a data transmission/reception system using a first clock signal and a second clock signal having a phase difference corresponding to a half of data bit period as compared with the first clock signal, comprises a skew information extracting unit for obtaining and outputting skew edge information data necessary for a skew removal by sampling data transmitted in a training operating mode as one of the first and second clock signals in a receiving side; and a timing control unit for receiving the skew edge information data through a transmitting side, and comparing its phase with the transmitted data and controlling a timing between transmission data and transmission sampling clock signal applied to a transmission output unit according to the phase comparison result.

In sampling the transmission data as the first clock signal, the transmission sampling clock signal of the transmitting side is traced to the second clock signal, and in sampling the transmission data as the second clock signal, the transmission sampling clock signal of the transmitting side is traced to the first clock signal.

When the first clock signal is an edge clock, the second clock signal is a data clock for a sampling of data.

The training operating mode may be performed when the transmitting side provides a command to the receiving side or may be automatically performed for a time interval that an access operation of data is not performed.

Further, when the skew information extracting unit is adapted in a semiconductor memory device, the timing control unit may be adapted in a memory controller.

In the configuration according to the embodiment of the invention, time taken in a training operation can be relatively reduced, and a circuit adapted in a receiving side can become relatively more simplified and power consumption can be reduced as compared with a conventional clock data recovery circuit. In addition, a dynamic skew problem that a skew between data and clock signal is frequently changed by a temperature or voltage change, can be solved by performing a skew removal for a refresh time period or performing a skew removal by applying a specific command.

According to another embodiment of the invention, a data transmission/reception system using a first clock signal and a second clock signal having a phase difference corresponding to a half of data bit period as compared with the first clock signal, comprises a skew removal circuit, the skew removal circuit including an increase/decrease information data extracting unit for obtaining increase/decrease information data necessary for a skew removal by individually sampling data transmitted in a training operating mode as the first and second clock signals in a receiving side and by comparing phases from its sampling result, and for outputting the data through a read request of the data; and a control unit for receiving the increase/decrease information data in a transmitting side, and controlling a phase of transmission sampling clock signal applied to a transmission output unit or controlling a timing of transmission data.

The transmission sampling clock signal of the transmitting side is traced to the second clock signal, and when the first clock signal is an edge clock, the second clock signal is a data clock for a sampling of data.

The training operating mode may be performed when the transmitting side provides a command to the receiving side or may be automatically performed for a time interval that an access operation of data is not performed. Further, when the increase/decrease information data extracting unit is adapted in a semiconductor memory device, the phase control unit may be adapted in a memory controller.

As described above, according to some embodiments of the invention, a circuit overhead of transmitting side can be lessened, and a skew removal operating time in a transmitting-side circuit can be shortened. Further, a skew removal is performed in a normal write operating mode or refresh time interval, or the skew removal is performed by using an applied specific command, thereby performing a skew removal operation in real time and furthermore solving a dynamic skew problem that a skew between data and clock signal is changed very often by a temperature or voltage change.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 3 illustrating an example of combined

FIG. 7 illustrates timings for a phase comparison operation providing a generation principle of up/down data to obtain an early/late signal referred to FIG. 4 in a training operation;

FIG. 8 illustrating an example of combined

DETAILED DESCRIPTION

Embodiments of the present invention now will be described more fully hereinafter with reference to FIGS. 3 to 10. This invention may, however, be embodied in many different forms and should not be construed as limited to the embodiments set forth herein. Rather these embodiments are provided so that this disclosure will be thorough and complete, and will fully convey the scope of the invention to those skilled in the art.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein. Exemplary embodiments of the present invention are more fully described below with reference to FIGS. 3 to 10. This invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art.

Figure 3A:
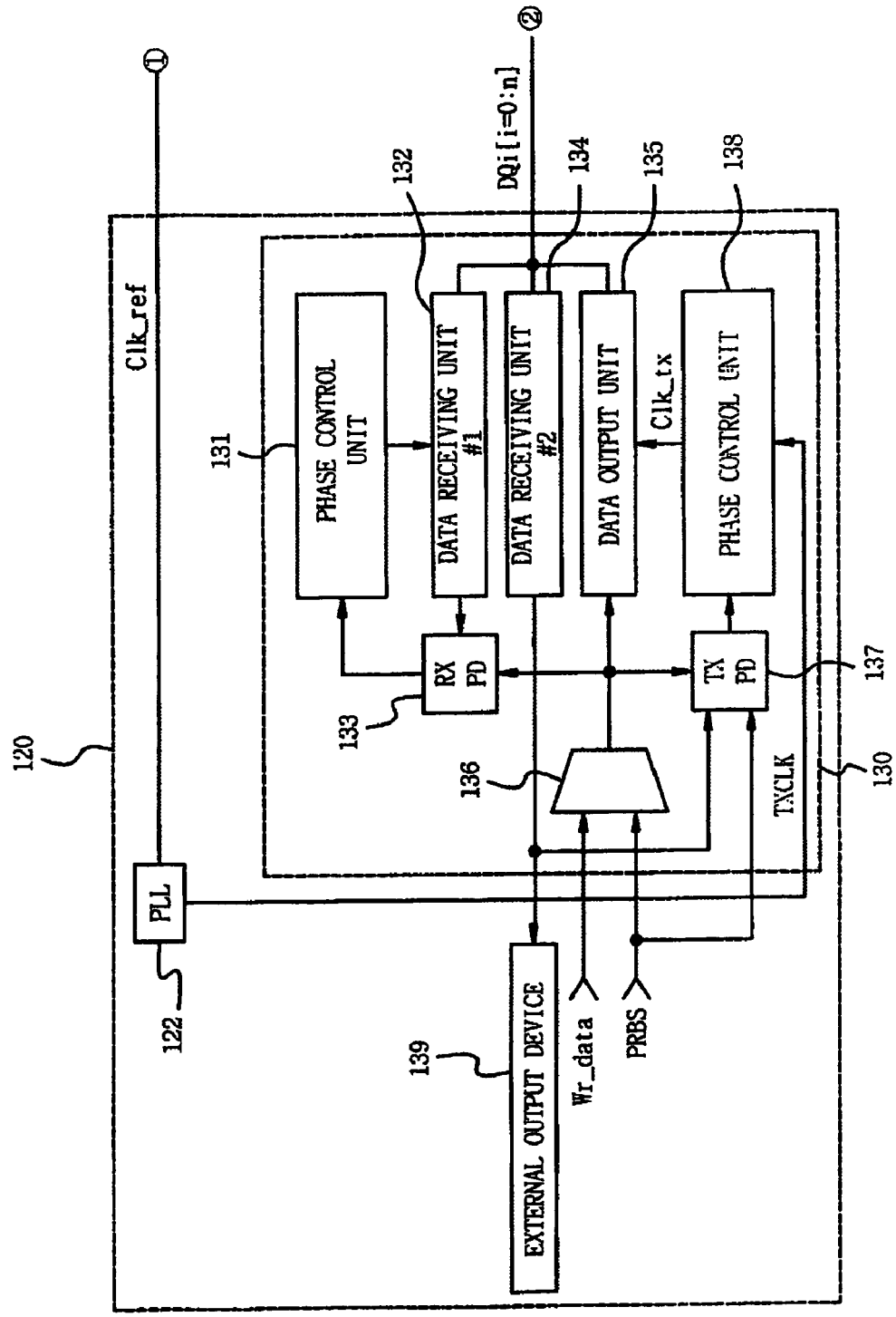
FIGS. 3A and 3B, is a block diagram of system comprising a skew removal circuit according to an embodiment of the invention.
Figure 3B:
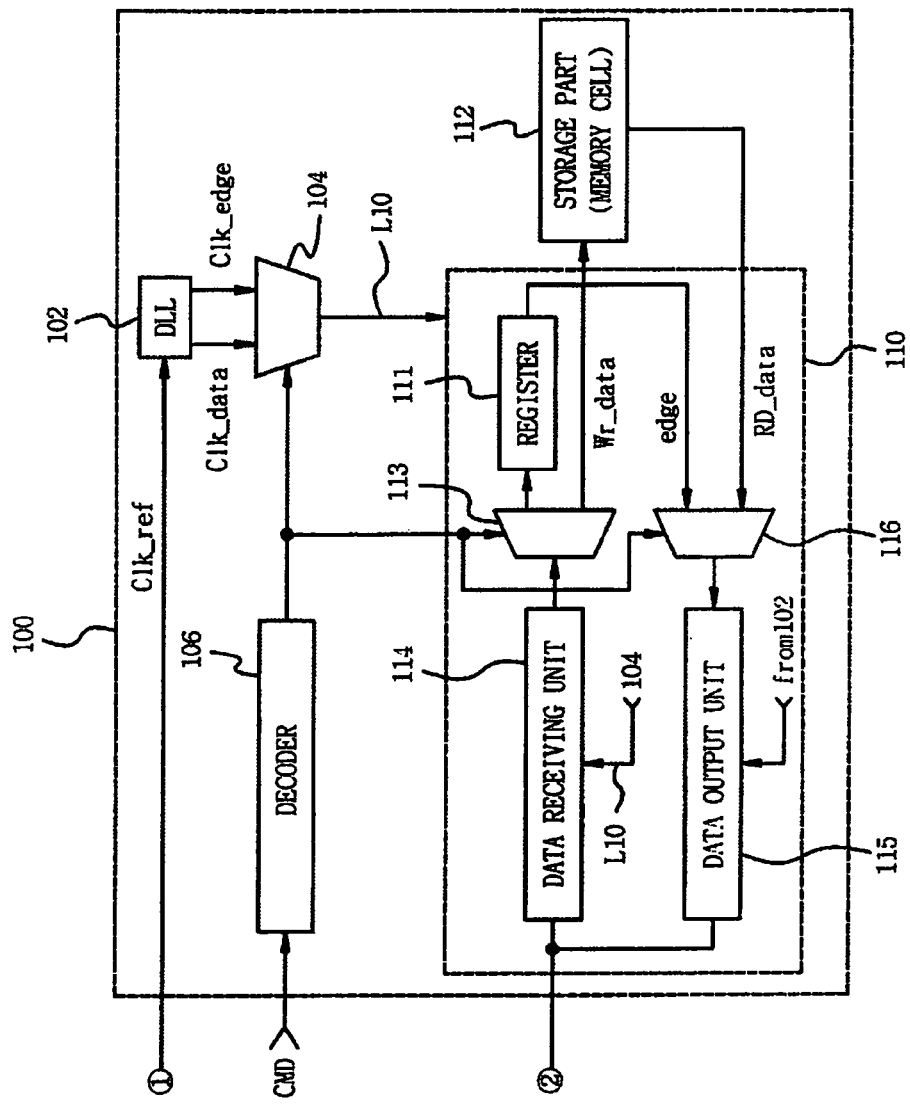

Referring first to FIG. 3 illustrating an example of combined FIGS. 3A and 3B, a system comprising a skew removal circuit is shown according to an embodiment of the invention.

In FIG. 3, a data transmission/reception system as a semiconductor integrated circuit device may be largely classified as two parts of FIGS. 3A and 3B. The two parts are each configured herein on mutually different chips, but may be combined on one chip according to some cases without deviating from the spirit of the invention. Here FIG. 3A is a chip of data transmitting side, and this may become a controller as a first integrated circuit. The controller may become a CPU, GPU (Graphic Processing Unit), MCU, memory controller or chipset. Meanwhile, FIG. 3B is a chip of data receiving side and may become a memory as a second integrated circuit. Here the memory is a volatile memory such as DRAM etc., but may become a nonvolatile memory such as PRAM etc. The DRAM may be a GDDR type or GQDR type appropriate to a processing of graphic data.

In the following description, FIG. 3A is called a memory controller and FIG. 3B is called a semiconductor memory device 100 just for a description, but it should be noted that the scope of the invention is not limited to that.

The semiconductor memory device 100 referred to in FIG. 3B comprises, as a circuit block to remove a skew inside the device, a transceiver 110 for providing data to the memory controller 120 and receiving data from the memory controller 120, a command decoder 106 for receiving an applied command and decoding the command, a DLL 102 connected to a PLL 122 of the memory controller 120, for generating clock signals necessary for the transceiver 110, and a multiplexer 104 for selecting one of first and second clock signals and applying the signal to an output line L10 in response to an output of the command decoder 106. Here the transceiver 110 comprises a data receiving unit 114, data output unit 115, switch 113, multiplexer 116 and register 111. Meanwhile, a storage part 112 may be constructed of, i.e., memory cells, and stores write data and outputs read data.

Although in FIG. 3B, the DLL 102 is coupled to the PLL 122 of the memory controller 120 and is provided as the configuration to receive a reference clock clk_ref, embodiments of the invention is not limited to that. That is, instead of adapting the DLL 102, a PLL circuit for generating itself a reference clock and dividing or multiplying the clock and thus generating data clock and edge clock may be employed.

The data receiving unit 114 receives data output from the memory controller 120 through a corresponding pin DQI among data input/output pins DQ[0:n]. For example, when a transmission speed of data is hundreds of Mbps, 1 bit data is transmitted to an input pin of semiconductor memory device through an output pin of the memory controller every several through decades of ns. In this case, a clock signal provided to the data receiving unit 114 is an output of the multiplexer 104. In a training operating mode for a skew correction, a first clock signal as an edge clock clk_edge is applied as a reception sampling clock to the data receiving unit 114. In a normal operating mode for a write and read operation of data, a second clock signal as a data clock clk_data is applied as a reception sampling clock to the data receiving unit 114. Output data output from the data receiving unit 114 is applied to the switch 113.

The switch 113 applies output data of the data receiving unit 114 to one of the register 111 and the storage part 112 according to an output of the command decoder 106. In the training operating mode, output data of the data receiving unit 114 is stored in the register. In this cases the output data is not normal write data, but edge information data got by sampling training data transmitted for the skew correction as the edge clock clk_edge. This is called herein skew edge information data for an easy description.

On the other hand, in the normal operating mode, output data of the data receiving unit 114 becomes sampled write data as a data clock clk_data, and is stored in the storage part 112, passing through the switch 113.

The data output unit 115 receives data output from the multiplexer 116 and outputs the data to one corresponding pin DQi of the data input/output pins DQ[0:n]. Here, output clock applied to the data output unit 115 is a read clock signal applied from the DLL 102. The read clock signal is a signal distinct from the first and second clock signals in view of a phase.

The multiplexer 116 selectively outputs one among skew edge information data stored in the register 111 and read data of the storage part 112 according to an output of the command decoder 106. In the training operating mode, the skew edge information data is output from the multiplexer 116. In the normal operating mode, the read data is output from the multiplexer 116.

The configuration of skew removal circuit included in the memory controller 120 shown in FIG. 3A is described as follows.

In FIG. 3A, the memory controller 120 comprises a PLL 122 for a generation of phase synchronous reference clock signal Clk_ref, and a transceiver 130 for transmitting data to the semiconductor memory device 100 and receiving data from the semiconductor memory device 100.

The transceiver 130 comprises a multiplexer 136, data receiving unit 132, 134, data output unit 135, transmission phase detecting unit TX PD 137, reception phase detecting unit RX PD 133 and phase control unit 131, 138.

The data receiving unit 132, reception phase detecting unit 133 and phase control unit 131 perform an operation of controlling a sampling timing of reception data in a normal read operation. Thus the data receiving unit 132, reception phase detecting unit 133 and phase control unit 131 are not related to a training operation for a removal of skew.

Meanwhile, in the training operating mode, the multiplexer 136, data reception unit 134, data output unit 135, transmission phase detecting unit 137 and phase control unit 138 operate to control a timing between a transmission sampling clock signal and transmission data.

The multiplexer 136 selects one of pseudo data pattern (PRBS; Pseudo Random Binary Sequence) and write data Wr_data to be written to memory cell 112 of the semiconductor memory device 100, and applies it to the data output unit 135. In the normal operating mode, write data is applied to the data output unit 135. In the training operating mode, the pseudo data pattern PRBS similar to a pattern of write data is applied to the data output unit 135. When the pseudo data pattern is transmitted as training data through the data input/output pin DQi[i=0:n], the data is transmitted synchronizing to a transmission sampling clock signal clk_tx.

The training data transmitted in the training operating mode is applied to data receiving unit 114 among receiving side circuits of FIG. 3B. The data receiving unit 114 obtains skew edge information data necessary for a removal of skew by receiving the training data and sampling it as the edge clock clk_edge. The skew edge information data is stored in the register 111. The register 111 may be realized as a flipflop circuit etc., to have a storage space of storing training data of predetermined bit number, i.e., 32 bits, 64 bits. But it is available, of course, to store the skew edge information data in a memory cell without adapting the register 111 or to immediately output the data to the transmitting side circuit without the storage operation described above.

When in the training operating mode, the memory controller 120 of the transmitting side requests a read of the skew edge information data through a command or specific operating cycle, the skew edge information data is applied to data input/output pin DQi[i=0:n] of the transmitting side through the multiplexer 116 and the data output unit 115.

Therefore, the transmitting side of FIG. 3A receives the skew edge information data through the data receiving unit 134. The received skew edge information data is applied to the transmission phase detecting unit 137. The transmission phase detecting unit 137 compares phases of the skew edge information data and the transmitted training data on the basis of majority voting per transition bit, and generates an increase/decrease signal for a control of phase in the comparison result. The phase control unit 138 receiving the increase/decrease signal controls a phase of the transmission sampling clock signal clk_tx applied to the data output unit 135 in response to the increase/decrease signal. In this case, a timing of test data may be controlled by the increase/decrease signal in a state that the phase of the transmission sampling clock signal clk_tx remains intact.

Such skew removal operation may be performed repeatedly several or tens of times in an already-started one training operating mode. This is why a phase control level of transmission sampling clock signal is determined corresponding to a predetermined unit step.

In the skew removal circuit of FIGS. 3A and 3B, training data is sampled once every 1 bit data period by one kind of clock signal, thus an oversampling operation to obtain information of skew control does not occur. That is, a single sampling operation is performed. Thus, the number of data receiving units is reduced each one every pin, and so it is relatively easier to realize circuits in a receiving side, and power consumption is relatively reduced by performing the sampling with only one kind of clock signal, and further time taken in a training operation is shortened as compared with a conventional training scheme using training data to remove skew.

Figure 4:
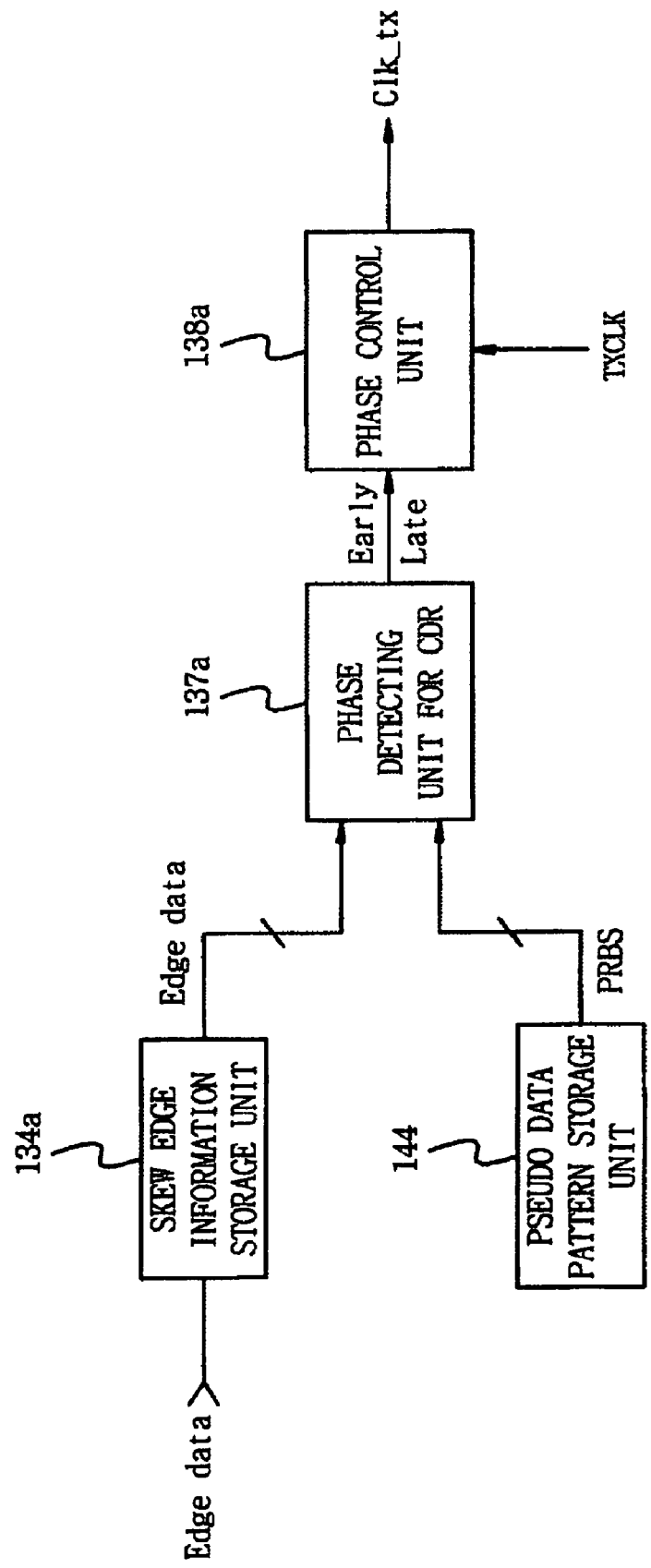
FIG. 4 is a block diagram illustrating in detail blocks related to a phase detection and control of 3A.
Figure 5:
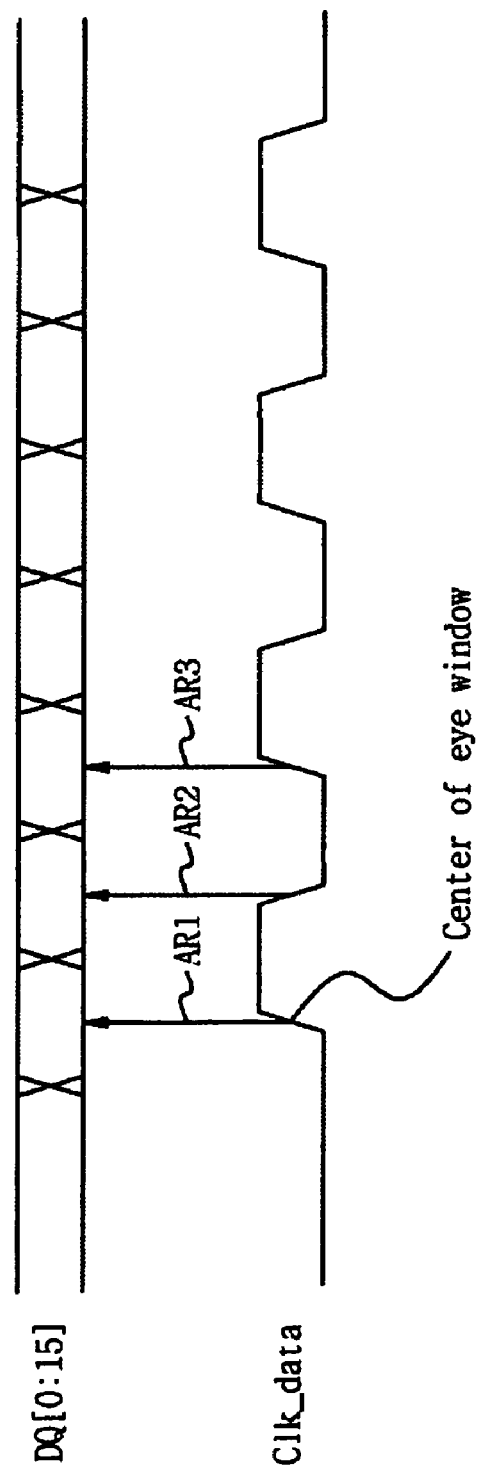
FIG. 5 illustrates signal timings providing a timing relation between a sampling clock and data in a receiving side in a normal operation of skew removal circuit shown in FIG. 3.
Figure 6:
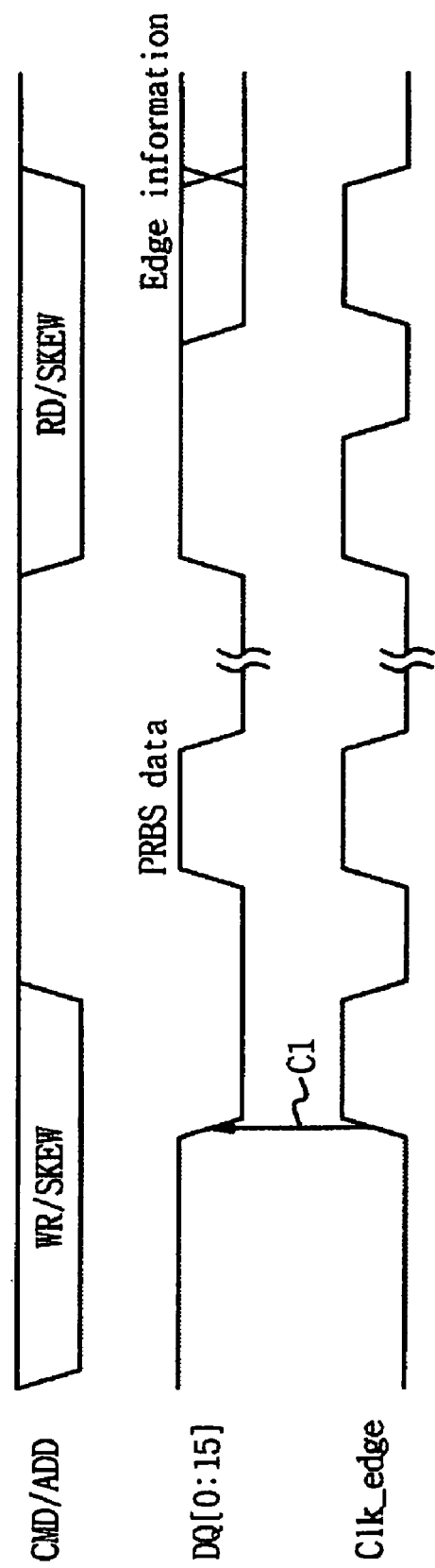
FIG. 6 illustrates signal timings providing a timing relation between an edge clock and data in a training operation of skew removal circuit shown in FIG. 3.

FIG. 4 is a block diagram illustrating in detail blocks related to a phase detection and control of 3A, and FIG. 5 illustrates a signal timing providing a timing relation between a sampling clock and data in a receiving side in a normal operation of skew removal circuit shown in FIG. 3. FIG. 6 illustrates a signal timing providing a timing relation between an edge clock and data in a training operation of skew removal circuit shown in FIG. 3. FIG. 7 illustrates a phase comparison operation timing providing a generation principle of up/down data to obtain an early/late signal referred to FIG. 4 in a training operation.

Figure 8A:
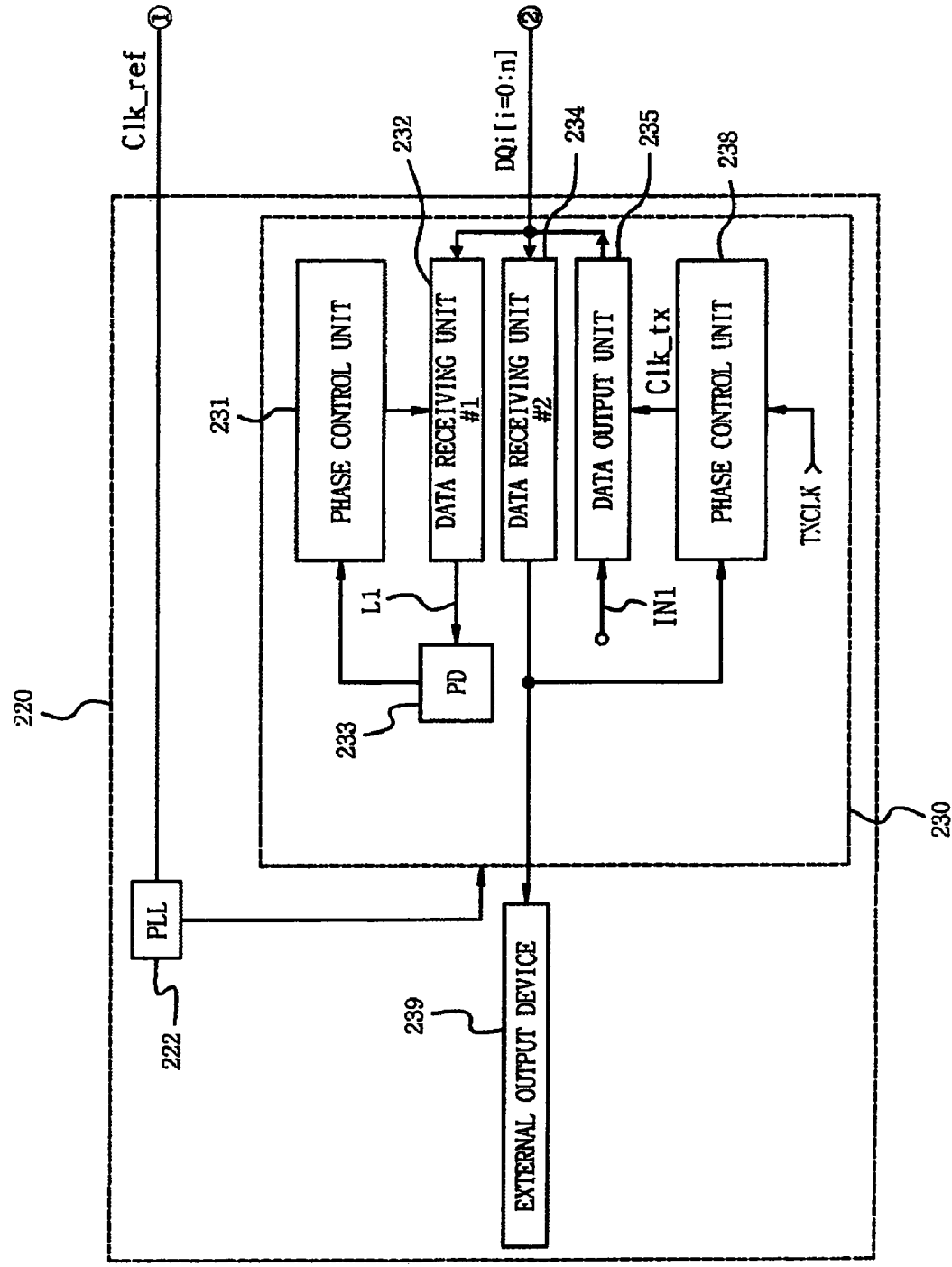
FIGS. 8A and 8B is a block diagram of system including a skew removal circuit according to another embodiment of the invention.
Figure 8B:
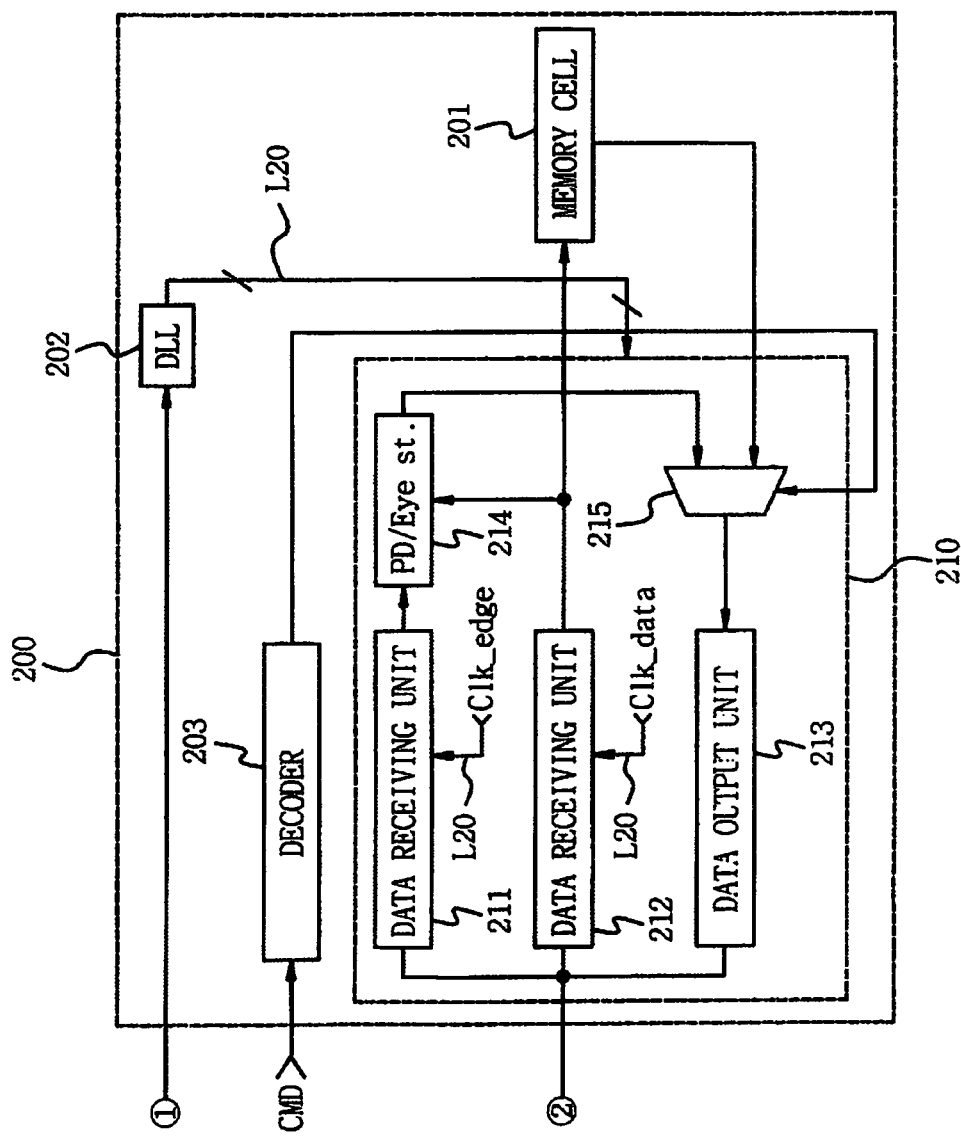
Figure 9:
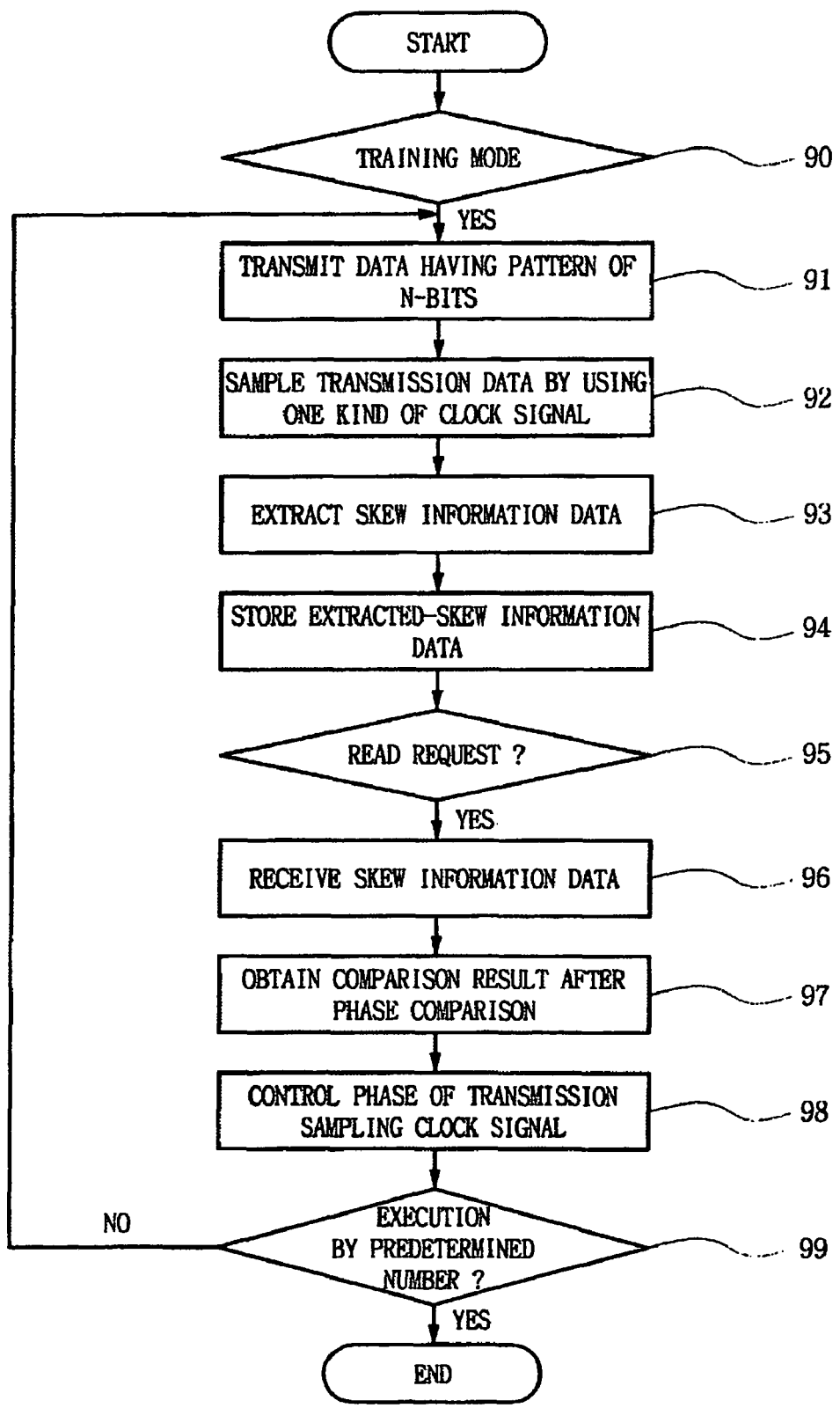
FIG. 9 is a flowchart of control operation for a skew removal method referred to in FIG. 3.
Figure 10:
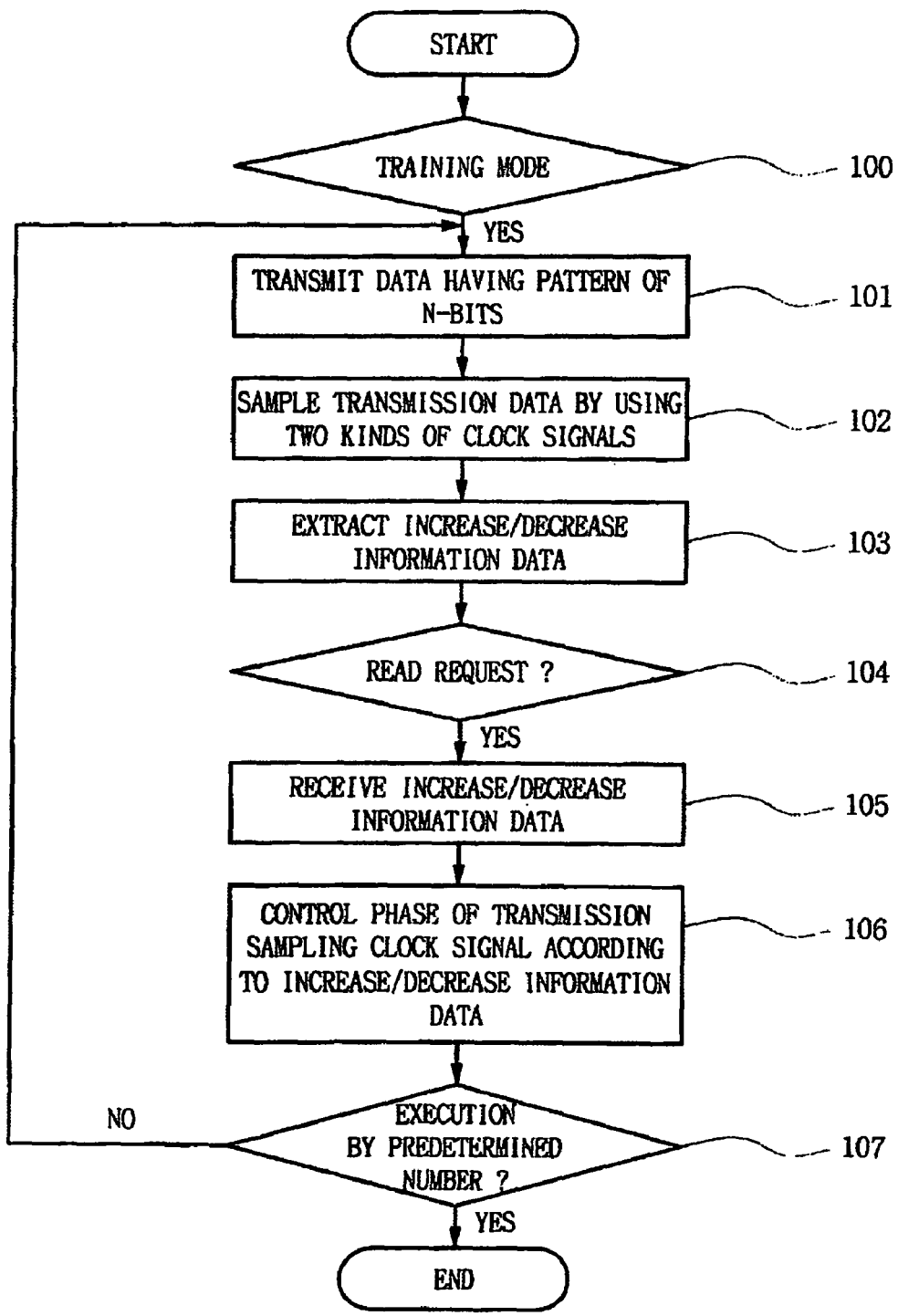
FIG. 10 is a flowchart of control operation for a skew removal method referred to FIG. 8.

FIG. 8 provided as the combination of FIGS. 8A and 8B is a block diagram of system including a skew removal circuit according to another embodiment of the invention. FIG. 9 is a flowchart of operation control offering a skew removal method referred to in FIG. 3. FIG. 10 is a flowchart of operation control offering a skew removal method referred to FIG. 8.

Referring to FIGS. 8 and 10 according to a second embodiment of the invention will be described below, and with reference to FIGS. 3, 4, 5, 6, 7 and 9, a skew removal operation according to a first embodiment of the invention is described as follows without deviating from the spirit of the invention.

The first embodiment is first described.

The configuration and operation of FIGS. 3A and 3B have been described above considerably. The memory controller 120 of FIG. 3A applies data write and data read command to the semiconductor memory device 100 in a training operating mode and thus obtains skew edge information data necessary for a removal of skew. And, phases of skew edge information data and data transmitted for a training are compared, and according to the comparison result, a timing between transmission data and a transmission sampling clock signal applied to the data output unit 135 as a transmission output part is controlled. Consequently, the semiconductor memory device 100 performs only a function for an extraction of skew edge information data, and the memory controller 120 employs a timing control unit so as to operate as a master.

To store write data in a memory cell of the semiconductor memory device 100 without error, operation according to embodiments of the invention is performed. That is, training operating mode is performed. The training operating mode may be divided into a training write operation and a training read operation. In the training write operation, the skew edge information data is stored in the register 111 of FIG. 3B. Further, in the training read operation, the skew edge information data is output through the data output unit 115 of FIG. 3B. In the latter part of training operating mode, phases of skew edge information data and data transmitted for the training are compared, and a timing between transmission sampling clock signal and transmission data is controlled by the comparison result. Therefore the skew between write data Wr_data transmitted in a normal operating mode and data clock for sampling write data in a receiving side can be removed or substantially reduced. That is, in this case, data clock C2 as the sampling clock of the receiving side has an exact timing relation of 0.5 UI (Unit Interval) with edge clock C1 synchronous to a data edge as illustrated in the case S1 of FIG. 1.

The training operating mode is performed in a refresh time interval applied to the first embodiments or when a specific command is applied.

A removal of dynamic skew based on a change of temperature or voltage change etc. may be performed in a refresh operating section of the semiconductor memory device 100 to prevent at best a drop of performance in the system. For example, in a CBR (CAS before RAS) refresh operating section, a data transmission between a memory controller 120 and the semiconductor memory device 100 does not occur, thus the drop of performance can be prevented at best by using this section.

When the system is initially booted or temperature or voltage change is severe, a specific command for a starting of specific training operating mode may be applied to command decoder of FIG. 3B.

When the semiconductor memory device 100 starts the training operating mode from a decoding operation result of the command decoder 106, the multiplexer 104 for a selection of clock signal selects a first clock signal, edge clock clk_edge, as a sampling clock of training data, and outputs it. But, when the transmitting side previously performs a control corresponding to 0.5 UI for a timing of transmission sampling clock signal clk_tk and transmits the training data, the second clock signal as data clock clk_data is output as a sampling clock of training data by a predetermined protocol. The relation between the data clock Clk_data for the training data and the edge clock Clk_edge has been described above referring to FIG. 1.

Referring to FIG. 4 provided to describe in detail blocks related to a phase detection and control of FIG. 3A, a wiring configuration of skew edge information storage unit 134a, pseudo data pattern storage unit 144, CDR phase detecting unit 137a and a phase control unit 138a is illustrated.

The skew edge information storage unit 134a corresponds to the data receiving unit 134 of FIG. 3A, and the CDR phase detecting unit 137a corresponds to the transmission phase detecting unit 137 of FIG. 3A. The phase control unit 138a corresponds to the phase control unit 138 of FIG. 3A. The pseudo data pattern storage unit 144 may be constructed of register and is arranged to provide pseudo data pattern as training data according to an embodiment of the invention. The reason of using PRBS data as the training data is to transmit pattern similar to in a transmission of actual data and perform the training in an environment with Jitter as error of time axis or noise.

The CDR phase detecting unit 137a receives skew edge information data output from the skew edge information storage unit 134a and the PRBS data, and compares phases of the skew edge information data Edge data and the training data PRBS per transition bit on the basis of majority voting, and generates an increase/decrease signal Early, Late for a phase control in its comparison result.

FIG. 7 illustrates timings of phase comparison operation providing a generation principle of up/down data to obtain an early/late signal referred to in FIG. 4, in a training operation.

In FIG. 7, three cases CASE1, CASE2, CASE3 for a phase comparison timing are provided. First, as sown in the case 1, for example, when training data PRBS is given and skew edge information data Edge data is obtained as 0, 1, 0, 1, . . . , this indicates that a phase of edge clock is anterior by ΔL to an edge (ref) of the training data. That is, since sampling time points of sampling the training data in the data receiving unit 114 are provided as time points of t1, t2, t3 and t4, the skew edge information data Edge data is received as 0, 1, 0, 1, . . . . Thus, in this case, up signals to delay a phase of edge clock or advance a phase of data are provided as phase update data. As a result, in the CASE1, the up signals are majority, the result based on the majority voting is decided as the up signal. Therefore, in the case 1, the increase/decrease signal Early to delay a phase of transmission sampling clock signal clk_tx or advance a phase of data is generated from the CDR phase detecting unit 137a.

Further, as shown in the case 2 of FIG. 7, for example, when training data PRBS is given and skew edge information data Edge data is obtained as 1, 0, 1, 0, . . . , this indicates that a phase of edge clock is delayed by ΔR as compared with an edge of the training data. That is, since sampling time points of sampling the training data are provided as the same time points as t1, t2, t3 and t4, the skew edge information data Edge data is received as 1, 0, 1, 0, . . . . Thus, in this case, down signals are represented as phase update data. As a result, in the CASE2, the result based on the majority voting is decided as the down signal. Therefore, in the case 2, increase/decrease signal Late to advance a phase of transmission sampling clock signal clk_tx or delay a phase of data is generated from the CDR phase detecting unit 137*a*.

As shown in the case 3 of FIG. 7, for example, when training data PRBS is given and skew edge information data Edge data is obtained as 0, 1, 0, 1, 0, 1, 1, 0 . . . , this indicates a mixture of states that a phase of edge clock is advanced (-□) or delayed (+□) by Δ as compared with an edge (ref) of the training data. That is, since sampling time points of sampling the training data are provided as time points of t1, 2, t3 and t4, t5, t6, the skew edge information data Edge data is received as 0, 1, 0, 1, 0, 1, and further, since provided as time points like t7, t8, the skew edge information data is received as 1, 0, . . . to the CDR phase detecting unit 137*a*. Thus, in this case, six up signals and two down signals are represented, and thus the up signal becomes majority according to the majority voting. Therefore, in the case 3, increase/decrease signal Early to delay a phase of transmission sampling clock signal clk_tx is generated from the CDR phase detecting unit 137*a*. In addition, the number of up signals and down signals is the same, a hold signal may be output.

Figure 1:
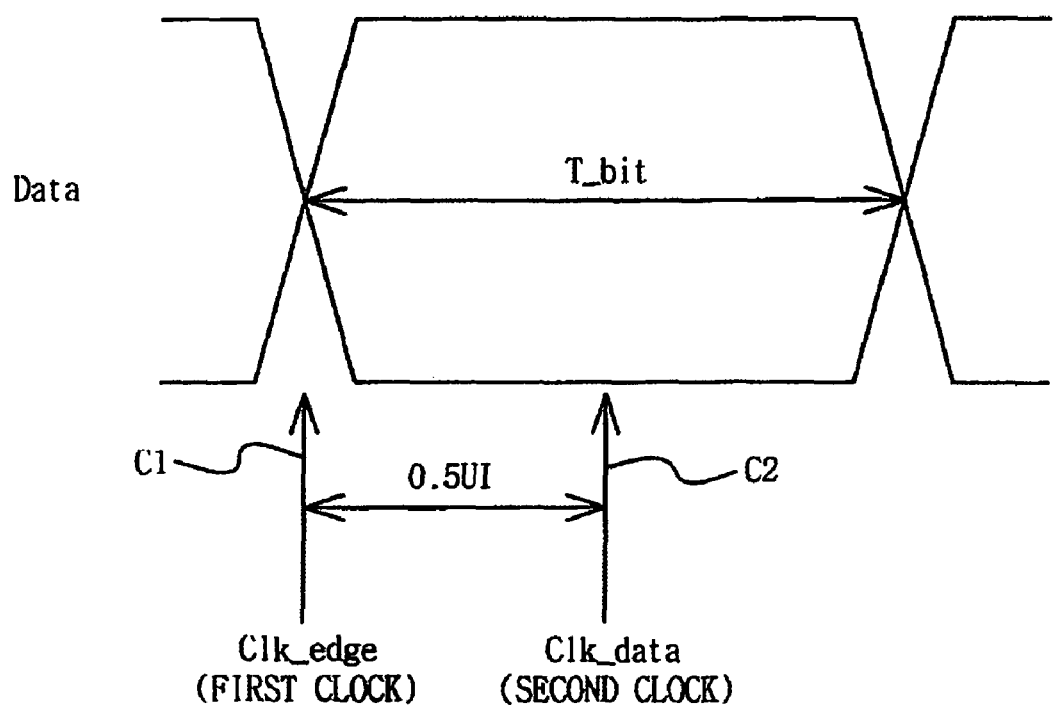
FIG. 1 illustrates a signal timing for a correlation between clock signals and data used in the CDR scheme according to a conventional art.
Figure 2:
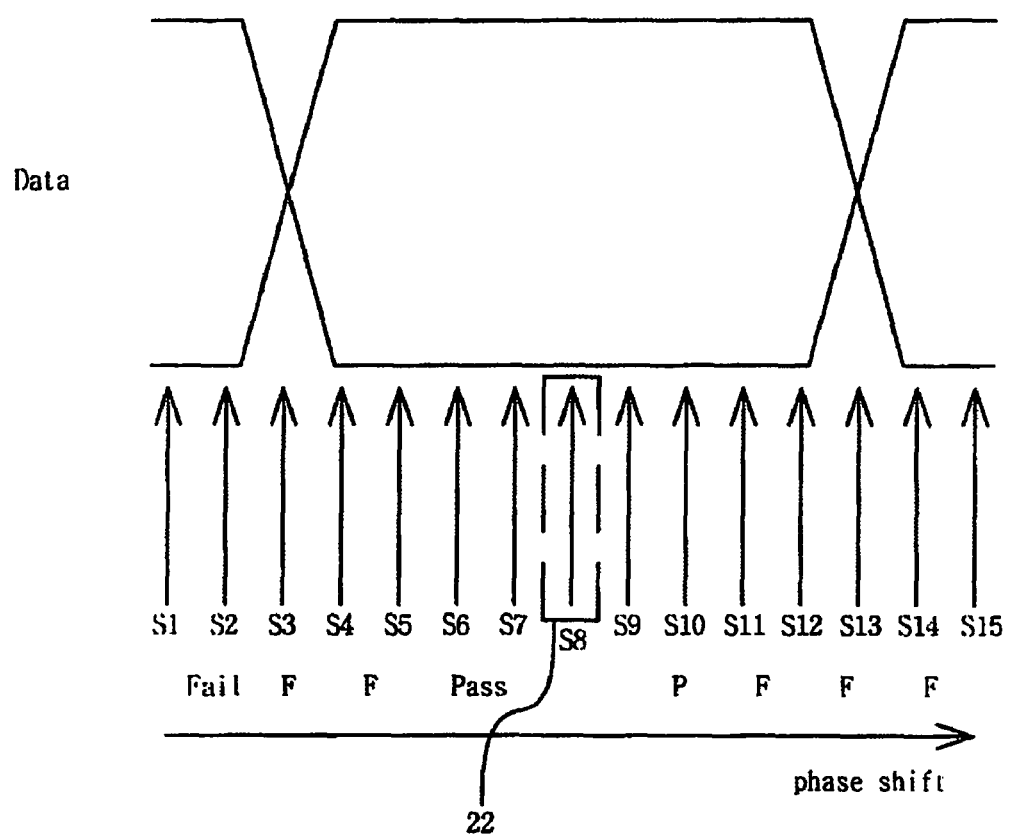
FIG. 2 illustrates signal timings providing a correlation between clock signals and training data used in a training scheme according to another conventional art.

More in detail, in the case 1, a phase of edge clock is anterior to an edge of training data, thus this is similar to the case S3 of FIG. 1. In this case, transmission data must be advanced forward in timing or the clock signal must be shifted backward in timing.

The case 2 is opposite to the case 1, thus similar to the case S2 of FIG. 1. In this case, transmission data must be shifted backward in timing, or the clock signal must be advanced forward in timing.

The case 3 is a case approximate to the case S1 of FIG. 1, thus the majority voting is used very considerably. In other words, the CDR phase detecting unit 137*a* compares the number of up and down signals appearing every transition section of training data, and decides whether a signal corresponding to the majority is an up signal or down signal, and then outputs an increase/decrease signal Early, Late therefrom.

The phase control unit 138*a* may be constructed of DLL, and controls by a unit control amount a phase of transmission sampling clock signal clk_tx as an output signal according to the increase/decrease signal Early, Late. That is, the phase control unit 138*a* receives a reference transmission clock TXCLK from the PLL 122 of FIG. 3A, and controls a phase by the increase/decrease signal Early, Late and outputs the controlled clock as the transmission sampling clock signal clk_tx.

Frequency of the transmission sampling clock signal clk_tx, frequency of the reference clock signal clk_ref and frequency of the first and second clock signals are determined equally except a case of multiplication or division.

FIG. 6 illustrates a signal timing providing a timing relation between an edge clock and data in a training operation of skew removal circuit shown in FIG. 3. With reference to FIG. 6, a training operation command CMD for a skew removal is divided into a training write command WR/SKEW and a training read command RD/SKEW. When the training write command WR/SKEW is applied to command decoder 106 of 3B, the multiplexer 104 selects as a reception sampling clock the first clock signal clk_edge shown in waveform Clk_edge of FIG. 6. Then, the data receiving unit 114 of FIG. 3B samples the training data PRBS transmitted as shown in waveform DQ[0:15] of FIG. 6 as the first clock signal clk_edge. In this case, the first clock signal clk_edge has a phase difference corresponding to 0.5 UI from second clock signal clk_data, thus extracting edge information of training data. Here a length of the training data pattern may be decided by the number of bits of a level capable of reflecting all pseudo patterns. For example, 16 bit, 32 bit or 64 bit pattern data may be selectively used.

For example, when the sampling occurs exactly at a time point C1 of FIG. 6, skew is not caused, but in general cases requiring the removal of skew, phases of data edge and edge clock have a variable skew as referred to in the case S2 or S3 of FIG. 1. As the result the training data PRBS is sampled as the first clock signal clk_edge, the skew edge information data is stored at the register 111. Even though in the drawings, one sampling time point C1 is shown, it should be noted that skew edge information data may be generated every rising edge and falling edge of the first clock signal. In FIGS. 6 and 5, the sampling operation occurs at rising and falling edges of clock signal, thus DDR operation is performed. But, this is just an example, thus it may be extended being applied to the case of SDR or QDR.

In the training read operation, when the training read command RD/SKEW is applied to the command decoder 106 of FIG. 3B, the skew edge information data stored in the register 111 is selected by multiplexer 116 of FIG. 3B. Data output unit 115 coupled to an output terminal of the multiplexer 116 outputs the skew edge information data in synchronous to applied-read clock signal, to the transmitting side the memory controller 120 is positioned. Here the read clock signal is a clock applied from the DLL 102, and is a signal separate from and independent of the first and second clock signals in view of a phase.

When the memory controller 120 receives the skew edge information data in the training operating mode, as described above the training data transmitted for the training and the skew edge information data are compared for phases thereof according to the majority voting referred to FIG. 7, and a timing between transmission sampling clock signal clk_tx and transmission data (this case, Wr_data or PRBS) is controlled in the transmitting side according to its comparison result. Thus, like the case S1 of FIG. 1, data clock C2 as the sampling clock in the receiving side is controlled to have a timing relation of exact 0.5 UI with edge clock C1 synchronizing to data edge.

Referring now to FIG. 5, when after the training operating mode for the removal of skew is completed, a normal write command CMD is applied to command decoder 106 of FIG. 3B in the normal operation, the multiplexer 104 selects second clock signal clk_data as shown in waveform Clk_data of FIG. 5 as the reception sampling clock signal. Then, the data receiving unit 114 of FIG. 3B samples write data Wr_data transmitted as shown in waveform DQ[0:15] of FIG. 5 as the second clock signal clk_data. In this case, the second clock signal clk_data has a phase difference corresponding to 0.5 UI from the first clock signal clk_edge, and so is positioned in timing at a center part of the transmitted write data. In other words, as the receiving sampling clock is exactly positioned at a portion (center part of data) having a relatively largest time margin of data, that is, skew becomes relatively smallest, data transmitted from the transmitting side is definitely decided in the receiving side without error. When the skew removal operation is performed as described above, the data sampling clock of the receiving side synchronizes to a center of eye window of normal write data. Data sampling operation of FIG. 5 is the example for the case of DDR. Although arrow marks AR1-AR3 in the drawing are shown partially, it should be understood the sampling operation for a reception of data is performed at rising edge and falling edge of sampling clock signal.

FIG. 9 is a flowchart providing a sequential skew removing method according to a first embodiment of the invention.

In a step 90, a starting of training operating mode is performed when a skew removal operation is needed. For example, when training write command WR/SKEW described above with reference to FIG. 6 is applied to command decoder 106 of FIG. 3B, a step 91 is performed by passing the step 90. The step 91 is to transmit data having a pattern of N bits. For example, when pseudo data pattern PRBS of 32 bits is output through the data output unit 135, the step 91 is performed. When the step 91 is performed, a step 92 is performed in the receiving side such as semiconductor memory device etc. The step 92 is performed by sampling the pseudo data pattern PRBS as the training data through use of one a kind of clock signal as a receiving side sampling clock, excluding an oversampling operation. Except a case the training data is intentionally shifted to correspond to edge clock, the one kind of clock signal may become first clock signal Clk_edge.

When the sampling operation of the step 92 is performed and a switching operation of switch 113 in FIG. 3B is performed, skew edge information data is extracted in a step 93. That is, the extraction of skew edge information data is obtained when the sampling operation is performed as shown in the time point C1 of FIG. 6 and then the sampled PRBS data is passed through the switch 113. The storage of skew edge information data extracted in a step 94 is obtained by writing the skew edge information data in the register 111 of FIG. 3B.

A read request in a step 95 is obtained by applying training read command RD/SKEW referred to in FIG. 6 to the command decoder 106 of FIG. 3B. The reception of skew edge information data in a step 96 is realized as the data receiving unit 134 of FIG. 3A receives the skew edge information data.

An operation of step 97 can be attained as the CDR phase detecting unit 137a of FIG. 4 compares phases of the skew edge information data and the PRBS data on the basis of majority voting as illustrated in FIG. 7 and generates an increase/decrease signal Early, Late for a control of phase as its comparison result. An operation of step 98 can be obtained as the phase control unit 138a constructed of DLL controls a phase of transmission sampling clock signal clk_tx by a unit control amount in response to the increase/decrease signal Early, Late. It is checked in a step 99 whether write and read operations in the training operating mode have been performed corresponding to a predetermined number. Since it is difficult to completely remove skew through skew removal operation of one time, the skew removal operation may be repeatedly performed several to tens of times. When the repeated number becomes increased, the reliability of skew removal can increase, but a normal operation performance of the system may be limited, thus a proper tradeoff is required.

According to the first embodiment of the invention described above, the oversampling operation does not occur in the receiving side, thus only one data receiving unit per input/output pin is required. That is, it is relatively simpler to realize circuits in the receiving side, and power consumption is relatively more reduced as only one kind of sampling clock is used. In addition, time taken in a training operation for a removal of skew is reduced as compared with the conventional training scheme. Further, a dynamic skew problem that a skew between data and clock signal is frequently changed by a temperature or voltage change, can be solved as the skew removal is automatically performed for a refresh time period or is performed by applying a specific command. A second embodiment of the invention is described as follows, mainly referring to FIGS. 8 and 10.

In a schematic skew removal scheme according to the second embodiment, semiconductor memory device 200 as a receiving side directly extracts increase/decrease information data necessary for a removal of skew, and memory controller 220 as a transmitting side receives the increase/decrease information data intact and controls a phase of transmission sampling clock signal or time of transmitted data. For that, an oversampling operation is performed inside the semiconductor memory device 200. Thus, two data receiving units 211 and 212 are arranged, and a phase comparison unit 214 is added. Meanwhile, training write operation in the training operating mode performed in FIG. 3B is not applied in this case.

In FIG. 8, the data transmission/reception system may be largely divided into two parts of FIGS. 8A and 8B. FIG. 8A is a chip of data transmitting side and may become a controller. Meanwhile, FIG. 3B may become a memory as a chip of data receiving side. Though as described above according to the first embodiment, the memory is a volatile memory such as DRAM etc., the memory may become a nonvolatile memory. Further, the DRAM may become a GDDR type or GQDR type proper to a processing of graphic data.

In FIG. 8B there are shown a transceiver 210 for giving data to memory controller 220 and receiving data from the memory controller 220, a command decoder 203 for receiving and decoding applied data, and a DLL 202 that is coupled to a PLL 222 of the memory controller 220 and that generates clock signals necessary for the transceiver 210. Here the transceiver 210 comprises, for an oversampling, two data receiving units 211 and 212, data output unit 213, multiplexer 215, and phase detection and information storage unit 214. On the other hand, a memory cell 201 stores normal write data and outputs normal read data.

Although in FIG. 8B it is shown the configuration the DLL 202 is coupled to the PLL 222 of memory controller 220 to receive a reference clock clk_ref, embodiments of the invention are not limited to that. In other words, instead of employing the DLL 202, PLL circuit for generating itself a reference clock and dividing or multiplying it and thus generating data clock and edge clock may be employed in FIG. 8B.

With reference to FIG. 8A, the memory controller 220 comprises a PLL 222 for generating a phase synchronizing reference clock signal Clk_ref, and a transceiver 230 for transmitting data to the semiconductor memory device 200 and receiving data from the semiconductor memory device 200.

Unlike FIG. 8B, the transceiver 230 comprises a data receiving unit 232 and 234, data output unit 235, phase detecting unit 233 and phase control unit 231, 238.

The data receiving unit 232, phase detecting unit 233 and phase control unit 231 perform an operation of controlling a sampling timing of reception data in a normal read operation. Thus, the data receiving unit 232, the phase detecting unit 233 and the phase control unit 231 are not related to the training operation for a removal of skew.

On the other hand, in the training operating mode, the data receiving unit 234, data output unit 235 and phase control unit 238 operate to control a timing of transmission sampling clock signal and transmission data.

One of PRBS and write data Wr_data to be written to memory cell 201 may be selectively applied to an input line IN1 of the data output unit 235. When the write data Wr_data is selected in a normal write operation, and in the training operating mode, the pseudo data pattern PRBS is selected. Such selection can be obtained by employing multiplexer 136 as shown in FIG. 3A.

The skew removal is valid even in the normal write operating mode, thus write data can be applied as skew removal data to the data output unit 235. Further, in the training operating mode, the pseudo data pattern PRBS similar to pattern of write data is applied as training data. The write data or pseudo data pattern is transmitted synchronizing to transmission sampling clock signal clk_tx through the data input/output pin DQi[i=0:n].

The training data transmitted in the training operating mode or the write data transmitted to remove skew in the normal write operating mode are all applied to data receiving unit 211, 212 among circuits of the receiving side of FIG. 8B. The data receiving unit 211 receives the data and samples it as the edge clock clk_edge and then obtains edge information data. The data receiving unit 212 receives the training data and samples it as the data clock clk_data and then obtains data-information data. Here the edge clock may be a first clock signal, and the data clock may be a second clock signal having a phase difference corresponding to a half of data bit period as compared with the first clock signal. For the result individually sampled as the first and second clock signals, phases are compared in the sample scheme as operation of FIG. 7 described above, through the phase detection and information storage unit 214. Therefore, increase/decrease information data necessary for the skew removal is obtained inside the semiconductor memory device 200. The phase detection and information storage unit 214 may be realized through a combination of the CDR phase detector and flipflop circuit to have a storage space where training data of predetermined bit number, i.e., 32 bits, 64 bits, can be stored. On the other hand, the increase/decrease information data may be stored in a memory cell without adapting the flipflop circuit, or may be directly output to a circuit of the transmitting side without such storage operation, of course.

For example, when read command is provided from the controller 220, the increase/decrease information data is applied to data receiving unit 234 of FIG. 8A, sequentially passing through multiplexer 215 and data output unit 213.

The phase control unit 238 of FIG. 8A functions as a control unit for receiving the increase/decrease information data and controlling a phase of transmission sampling clock signal applied to the data output unit 235 as the transmission output unit or controlling a timing of data.

Though the oversampling operation of FIG. 8B may continue even in normal write operation, including the training operating mode, of course; the oversampling operation may be performed only in the training operating mode for the removal of skew to reduce power consumption. In comparing the second embodiment with the first embodiment, although functional circuits within the semiconductor memory device 200 increase, the memory controller 220 receives only increase/decrease information data and thus can control a phase relatively simply, and so time taken in the skew removal operation can be shortened relatively more. That is, the skew removal can be performed even in the normal write operating mode, thus the skew removal operation can be got in real time. Refereeing to FIG. 10, the sequence in a skew removal method according to the second embodiment of the invention is provided in the flowchart.

In a step 100, a start of training operating mode is performed when a skew removal operation is required. For example, when the step 100 is passed by, a step 101 is performed. The step 101 is to transmit data having a pattern of N bits. For example, when pseudo data pattern PRBS of 32 bits is output through the data output unit 235 of FIG. 8A, the step 101 is performed. After the step 101 is performed, a step 102 is performed in a data receiving side such as semiconductor memory device etc. The step 102 is to perform the oversampling, and is performed by each sampling the pseudo data pattern PRBS as the training data through use of two kinds of clock signals as the sampling clock of receiving side.

After the oversampling of the step 102, in a step 103, the phase detection and information storage unit 214 of FIG. 8B compares phases for the sampled result as the respective first and second clock signals and then obtains increase/decrease information data necessary for a skew removal. Read request in a step 104 can be obtained when training read command RD/SKEW of FIG. 6 is applied to command decoder 203 of FIG. 8B.

In a step 105, the data receiving unit 234 of FIG. 8A receives the increase/decrease information data.

In a step 106, the phase control unit 238 controls by a unit control amount a phase of transmission sampling clock signal clk_tx according to the increase/decrease information data Early, Late.

That is, the transmitting side receives the increase/decrease information data and controls a phase of transmission sampling clock signal applied to the transmission output unit or controls a timing of transmitted data, in steps 105 and 106.

It is checked in a step 107 whether the training read operation in the training operating mode has been performed corresponding to a predetermined number. Further, similarly in this case, since it is difficult to completely remove skew through skew removal operation of one time, the skew removal operation may be repeatedly performed several to tens of times. When the repeated number becomes increased, the reliability of skew removal increases, but a normal operation performance of the system may be limited, thus a proper tradeoff is required.

Though in FIG. 10, the skew removal method in the training operating mode has been described, the second embodiment of the invention is not limited to that, that is, the skew removal may be performed in real time, performing write operation for normal write data in a normal write operation.

According to the second embodiment of the invention, a circuit overhead in a transmitting side can be lessened, and a skew removal operation time of transmitting side circuit can be shortened. In addition, the skew removal operation can be performed in real time through a skew removal of normal write operating mode or refresh time period or through a skew removal with an applied specific command. Furthermore, a dynamic skew problem that a skew between data and clock signal is frequently changed by a temperature or voltage change can be solved.

As described above, according to some embodiments of the invention, a training operation time for a removal of skew is relatively shortened. Additionally, circuits in the receiving side can be realized relatively simply, and power consumption is relatively more reduced. A dynamic skew problem in employing a single sampling scheme can be solved in a refresh time interval or by applying a specific command.

Further, in some embodiments of the invention employing an oversampling scheme, a circuit overhead of transmitting side can be lessened, and a skew removal operation time of transmitting side circuit can be shortened. Also, a skew removal is performed in a normal write operating mode or refresh time interval, or performed by applying a specific command, thereby obtaining the skew removal operation based on a real time and furthermore solving a dynamic skew problem that a skew between data and clock signal is frequently changed by a temperature or voltage change.

It will be apparent to those skilled in the art that modifications and variations can be made in the present invention without deviating from the spirit or scope of the invention.

Thus, it is intended that the present invention cover any such modifications and variations of this invention provided they come within the scope of the appended claims and their equivalents.

For example, though a skew removal is performed per input/output pin, the skew removal may be performed without employing an oversampling scheme designating one to several input/output pins in other cases. Additionally, even in performing the oversampling scheme, an increase/decrease signal may be directly output to a circuit of transmitting side without a specific data register of a receiving side.

Accordingly, these and other changes and modifications are seen to be within the true spirit and scope of the invention as defined by the appended claims.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of controlling skew between a clock signal and data in a data transmission/reception system that includes a transmitting side and a receiving side, the method comprising:
   transmitting a pseudo data pattern, synchronized with a transmission sampling clock signal, from the transmitting side to the receiving side during a training operating mode of the data transmission/reception system;
   sampling the transmitted pseudo data pattern at the receiving side using at least one of a first clock signal and a second clock signal during the training operating mode, and obtaining skew information data from the sampled pseudo data pattern;
   transmitting a read command from the transmitting side to the receiving side during the training operating mode;
   outputting the skew information data from the receiving side to the transmitting side in response to the read command from transmitting side in the training operating mode;
   receiving the skew information data at the transmitting side and controlling a phase of the transmission sampling clock signal according to the skew information data.

2. The method of claim 1, wherein the first and second clock signals are self-generated by the receiving side.

3. The method of claim 1, wherein the first and second clock signals are generated at the receiving side using the clock signal transmitted by the transmitting side.

4. The method of claim 1, further comprising operating the data transmission/reception circuit in a normal operating mode after the training operating mode,
   wherein the at least one of the first clock signal and the second clock signal is used in the sampling of the pseudo data pattern in the training operation mode, and
   wherein only the second clock signal among the first and second clock signals is used to sample the data transmitted from the transmitting side to the receiving side in the normal operating mode.

5. The method of claim 4, further comprising decoding a command at the receiving side to select one of the first and second clock signals for use in sampling.

6. The method of claim 4, wherein only the first clock signal among the first and second clock signals is used to sample to the pseudo data pattern in the training operation mode.

7. The method of claim 6, wherein the skew information data is indicative of a timing difference between the first clock signal and the pseudo data pattern.

8. The method of claim 4, wherein the sampling of the transmitted pseudo data pattern at the receiving side is executed using both the first clock signal and the second clock signal, and includes obtaining sampling results for the respective first and second clocks signals, wherein the skew information data is indicative of phase increase/decrease information.

9. The method of claim 8, wherein the controlling of the phase of the transmission sampling clock signal includes adjusting a timing of the transmission sampling clock signal in accordance with the phase increase/decrease information.

10. The method of claim 1, wherein the pseudo data pattern is a pseudo random data pattern.

11. The method of claim 1, further comprising operating the data transmission/reception circuit in a normal operating mode after the training operating mode,
   wherein a sequence of the transmitting the pseudo data pattern, sampling the transmitted pseudo data pattern, obtaining skew information data, transmitting the read command, outputting the skew information data, receiving the skew information data, and controlling the phase of the transmission sampling clock signal is repeated a plurality of times during the training operating mode.

* * * * *